US011139229B2

(12) United States Patent
Fay et al.

(10) Patent No.: US 11,139,229 B2
(45) Date of Patent: Oct. 5, 2021

(54) PACKAGE-ON-PACKAGE SEMICONDUCTOR ASSEMBLIES AND METHODS OF MANUFACTURING THE SAME

(71) Applicant: Micron Technology, Inc., Boise, ID (US)

(72) Inventors: Owen R. Fay, Meridian, ID (US); Jack E. Murray, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/536,490

(22) Filed: Aug. 9, 2019

(65) Prior Publication Data

US 2019/0363044 A1  Nov. 28, 2019

Related U.S. Application Data

(60) Continuation of application No. 16/027,041, filed on Jul. 3, 2018, now Pat. No. 10,381,297, which is a
(Continued)

(51) Int. Cl.
*H01L 23/498* (2006.01)
*H01L 21/48* (2006.01)
(Continued)

(52) U.S. Cl.
CPC ...... *H01L 23/49827* (2013.01); *H01L 21/486* (2013.01); *H01L 21/4853* (2013.01);
(Continued)

(58) Field of Classification Search
CPC . H01L 2225/06541; H01L 2225/06544; H01L 21/02063; H01L 21/76816; H01L 21/76877–76883; H01L 21/76897; H01L 21/486; H01L 23/5384; H01L 2221/1031; H01L 2221/1036;
(Continued)

(56) References Cited

U.S. PATENT DOCUMENTS 9,368,401 B2 * 6/2016 Teh ........................... H01L 24/82
9,418,926 B1 * 8/2016 Fay ......................... H01L 21/4853
(Continued)

*Primary Examiner* — Thanh Y. Tran
(74) *Attorney, Agent, or Firm* — Perkins Coie LLP

(57) ABSTRACT

Package-on-package systems for packaging semiconductor devices. In one embodiment, a package-on-package system comprises a first semiconductor package device and a second semiconductor package device. The first package device includes a base substrate including a first side having a die-attach region and a peripheral region, a first semiconductor die attached to the base substrate at the die-attach region, wherein the first semiconductor die has a front side facing the first side of the base substrate and a backside spaced apart from the first side of the base substrate by a first distance, and a high density interconnect array in the perimeter region of the base substrate outside of the die-attach region. The interconnect array has a plurality of interconnects that extend from the first side of the base substrate by a second distance greater than the first distance. The second semiconductor device package is electrically coupled corresponding individual interconnects.

20 Claims, 8 Drawing Sheets

Related U.S. Application Data division of application No. 15/229,668, filed on Aug. 5, 2016, now Pat. No. 10,032,703, which is a division of application No. 14/714,599, filed on May 18, 2015, now Pat. No. 9,418,926.

(51) Int. Cl.

| | |
|---|---|
| *H01L 23/13* | (2006.01) |
| *H01L 25/10* | (2006.01) |
| *H01L 25/00* | (2006.01) |
| *H01L 23/00* | (2006.01) |
| *H01L 25/065* | (2006.01) |
| *H01L 25/18* | (2006.01) |
| *H01L 23/31* | (2006.01) |

(52) U.S. Cl.
CPC ........ *H01L 23/13* (2013.01); *H01L 23/49838* (2013.01); *H01L 24/17* (2013.01); *H01L 24/81* (2013.01); *H01L 25/0652* (2013.01); *H01L 25/0657* (2013.01); *H01L 25/105* (2013.01); *H01L 25/18* (2013.01); *H01L 25/50* (2013.01); *H01L 23/3128* (2013.01); *H01L 23/49811* (2013.01); *H01L 24/13* (2013.01); *H01L 24/16* (2013.01); *H01L 24/48* (2013.01); *H01L 25/0655* (2013.01); *H01L 2224/131* (2013.01); *H01L 2224/1413* (2013.01); *H01L 2224/14179* (2013.01); *H01L 2224/16145* (2013.01); *H01L 2224/16225* (2013.01); *H01L 2224/16227* (2013.01); *H01L 2224/45099* (2013.01); *H01L 2224/48145* (2013.01); *H01L 2224/48227* (2013.01); *H01L 2225/0652* (2013.01); *H01L 2225/06517* (2013.01); *H01L 2225/06548* (2013.01); *H01L 2225/06572* (2013.01); *H01L 2225/06586* (2013.01); *H01L 2225/1023* (2013.01); *H01L 2225/1058* (2013.01); *H01L 2924/00014* (2013.01); *H01L 2924/01029* (2013.01); *H01L 2924/1434* (2013.01); *H01L 2924/1436* (2013.01); *H01L 2924/1437* (2013.01); *H01L 2924/1438* (2013.01); *H01L 2924/15153* (2013.01); *H01L 2924/15311* (2013.01); *H01L 2924/15321* (2013.01); *H01L 2924/15331* (2013.01); *H01L 2924/181* (2013.01)

(58) Field of Classification Search
CPC .......... H01L 2223/6616–6622; H01L 2224/05085–05098; H01L 2224/8203–82047; H01L 23/522–5389; H01L 23/49827; H01L 21/4853; H01L 24/17; H01L 25/065; H01L 25/02; H01L 25/0657; H01L 2225/06548; H01L 23/3128; H01L 24/13; H01L 24/16; H01L 24/48; H01L 2224/16145; H01L 2224/48145; H01L 2225/1058; H01L 2924/1434; H01L 2924/15153; H01L 2924/15311; H01L 2924/15331
See application file for complete search history.

(56) References Cited

U.S. PATENT DOCUMENTS

| | | | |
|---|---|---|---|
| 9,548,289 | B2 | 1/2017 | Lin et al. |
| 10,032,703 | B2* | 7/2018 | Fay ............... H01L 25/0657 |
| 10,381,297 | B2* | 8/2019 | Fay ............... H01L 23/49827 |
| 2006/0003495 | A1* | 1/2006 | Sunohara ........... H01L 24/82 |
| | | | 438/124 |
| 2011/0228464 | A1* | 9/2011 | Guzek ............... H01L 24/19 |
| | | | 361/679.31 |
| 2012/0227261 | A1* | 9/2012 | Inui ............... H05K 1/0206 |
| | | | 29/849 |
| 2013/0127054 | A1 | 5/2013 | Muthukumar et al. |
| 2014/0252646 | A1 | 9/2014 | Hung et al. |
| 2014/0312481 | A1 | 10/2014 | Choi et al. |
| 2015/0055312 | A1 | 2/2015 | Lee et al. |
| 2016/0056087 | A1 | 2/2016 | Lee et al. |

\* cited by examiner

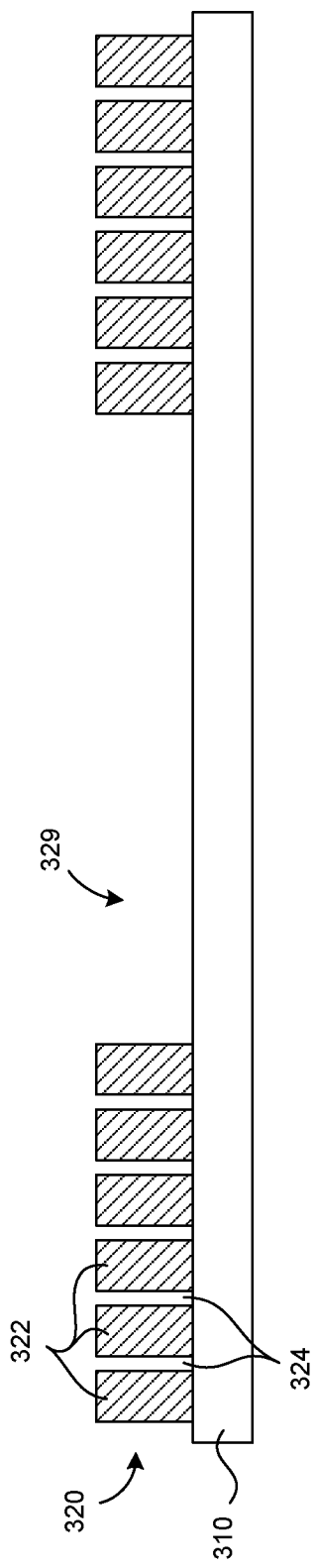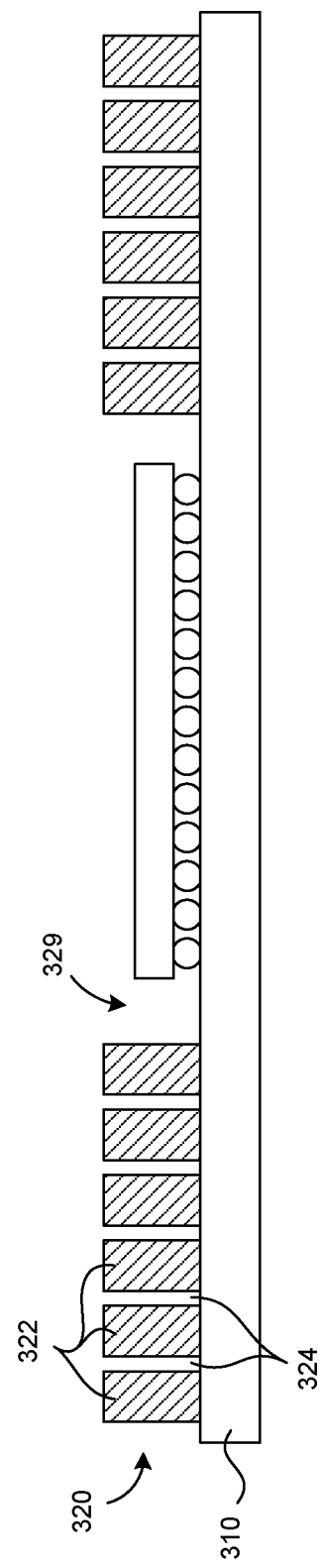

PACKAGE-ON-PACKAGE SEMICONDUCTOR ASSEMBLIES AND METHODS OF MANUFACTURING THE SAME

CROSS-REFERENCE TO RELATED APPLICATION(S)

This application is a continuation of U.S. patent application Ser. No. 16/027,041, filed Jul. 3, 2018, now U.S. Pat. No. 10,381,297, which is a divisional of U.S. patent application Ser. No. 15/229,668 filed Aug. 5, 2016, now U.S. Pat. No. 10,032,703, which is a divisional of U.S. patent application Ser. No. 14/714,599, filed May 18, 2015, now U.S. Pat. No. 9,418,926, each of which is incorporated herein by reference in its entirety.

TECHNICAL FIELD

The present technology is directed to packaging semiconductor devices, such as memory and processors, and several embodiments are directed to package-on-package assemblies that have high density interconnect arrays.

BACKGROUND

Packaged semiconductor dies, including memory chips, microprocessor chips, logic chips and imager chips, typically include a semiconductor die mounted on a substrate and encased in a plastic protective covering. The die includes functional features, such as memory cells, processor circuits, imager devices and other circuitry, as well as bond pads electrically connected to the functional features. The bond pads can be electrically connected to terminals outside the protective covering to allow the die to be connected to higher level circuitry.

Semiconductor manufacturers continually reduce the size of die packages to fit within the space constraints of electronic devices, while also increasing the functional capacity of each package to meet operating parameters. One approach for increasing the processing power of a semiconductor package without substantially increasing the surface area covered by the package (i.e., the "footprint") is to vertically stack multiple semiconductor dies on top of one another in a single package. The dies in such vertically-stacked packages can be interconnected by electrically coupling the bond pads of the individual dies with the bond pads of adjacent dies using through-silicon vias (TSVs).

Another approach for increasing the power or capacity of a system is to vertically stack separate packages in a package-on-package assembly (POP assembly) in which each package can have one or more vertically stacked dies. Conventional POP assemblies have a bottom package that includes a bottom substrate and a bottom die, a top package that includes a top substrate with a top die, and a plurality of large solder balls that electrically connect the bottom and top packages. Although such POP assemblies are useful and relatively inexpensive to manufacture, they are not well suited for high-density applications that require a large number of input/output connections in a small footprint. For example, conventional through mold via and solder ball interconnects are limited to a pitch of 300 μm (e.g., spacing between interconnects of 300 μm) because large solder balls require a significant amount of lateral real estate. This is not suitable for many applications that require a pitch of no more than 150 μm. Therefore, it would be desirable to develop a POP assembly that can provide suitably tight pitches to accommodate advanced devices.

BRIEF DESCRIPTION OF THE DRAWINGS

FIGS. 4A-4D are schematic cross-sectional views illustrating a method of forming a semiconductor package-on-package assembly in accordance with an embodiment of the present technology.

DETAILED DESCRIPTION

Specific details of several embodiments of stacked semiconductor die packages and methods of manufacturing such die packages are described below. The term "semiconductor device" generally refers to a solid-state device that includes semiconductor material. A semiconductor device can include, for example, a semiconductor substrate, wafer, or die that is singulated from a wafer or substrate. Throughout the disclosure, semiconductor devices are generally described in the context of semiconductor dies; however, semiconductor devices are not limited to semiconductor dies.

The term "semiconductor device package" can refer to an arrangement with one or more semiconductor devices incorporated into a common package. A semiconductor package can include a housing or casing that partially or completely encapsulates at least one semiconductor device. A semiconductor device package can also include an interposer substrate that carries one or more semiconductor devices and is attached to or otherwise incorporated into the casing. The term "stacked package assembly" or "package-on-package assembly" (POP assembly) can refer to an assembly of one or more individual semiconductor device packages stacked on each other.

As used herein, the terms "vertical," "lateral," "upper," and "lower" can refer to relative directions or positions of features in the semiconductor device or package in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, vertical/horizontal and left/right can be interchanged depending on the orientation.

Figure 1A:
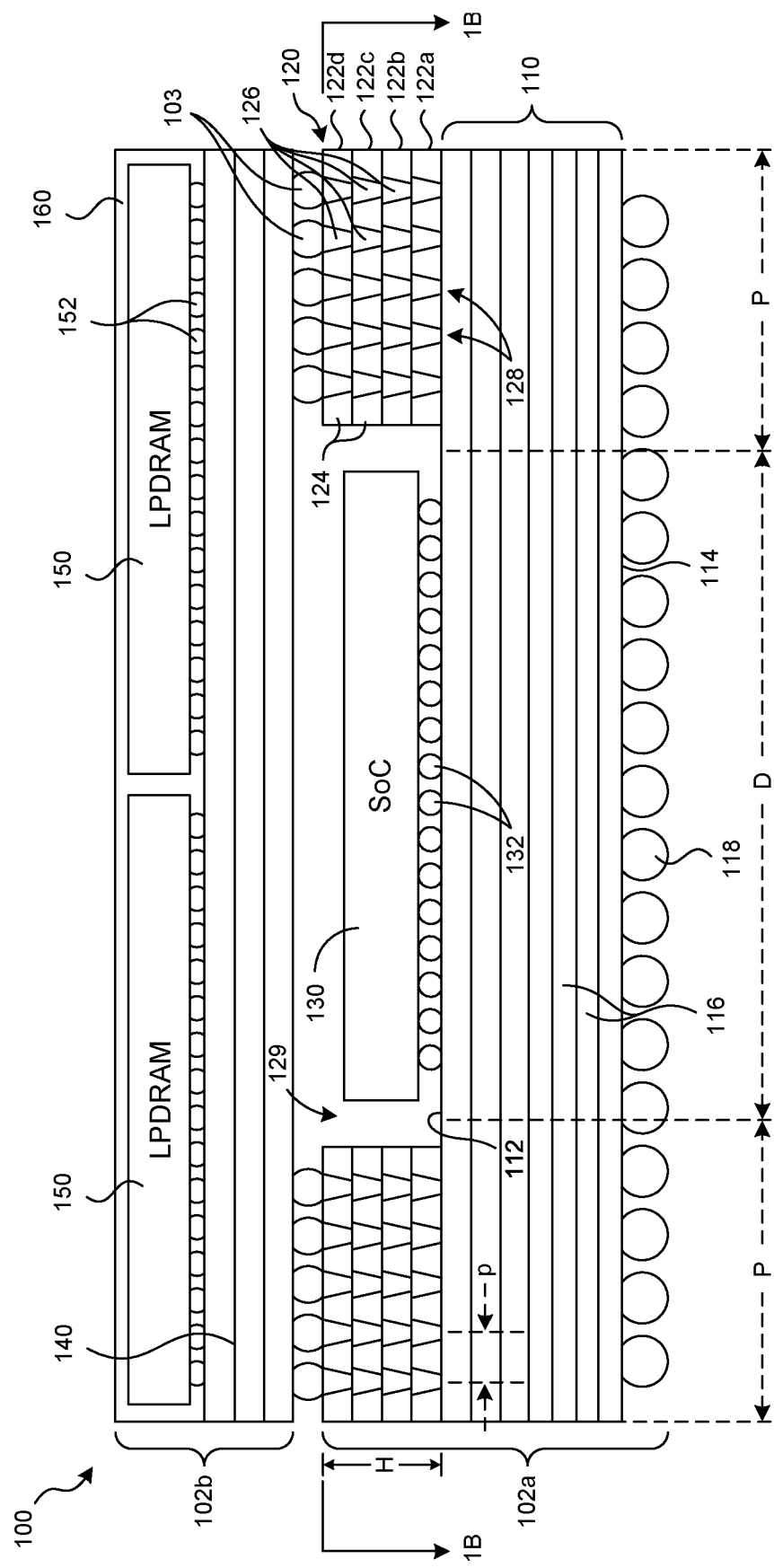
FIG. 1A is a schematic cross-sectional view of a semiconductor package-on-package assembly in accordance with an embodiment of the present technology.
Figure 1B:
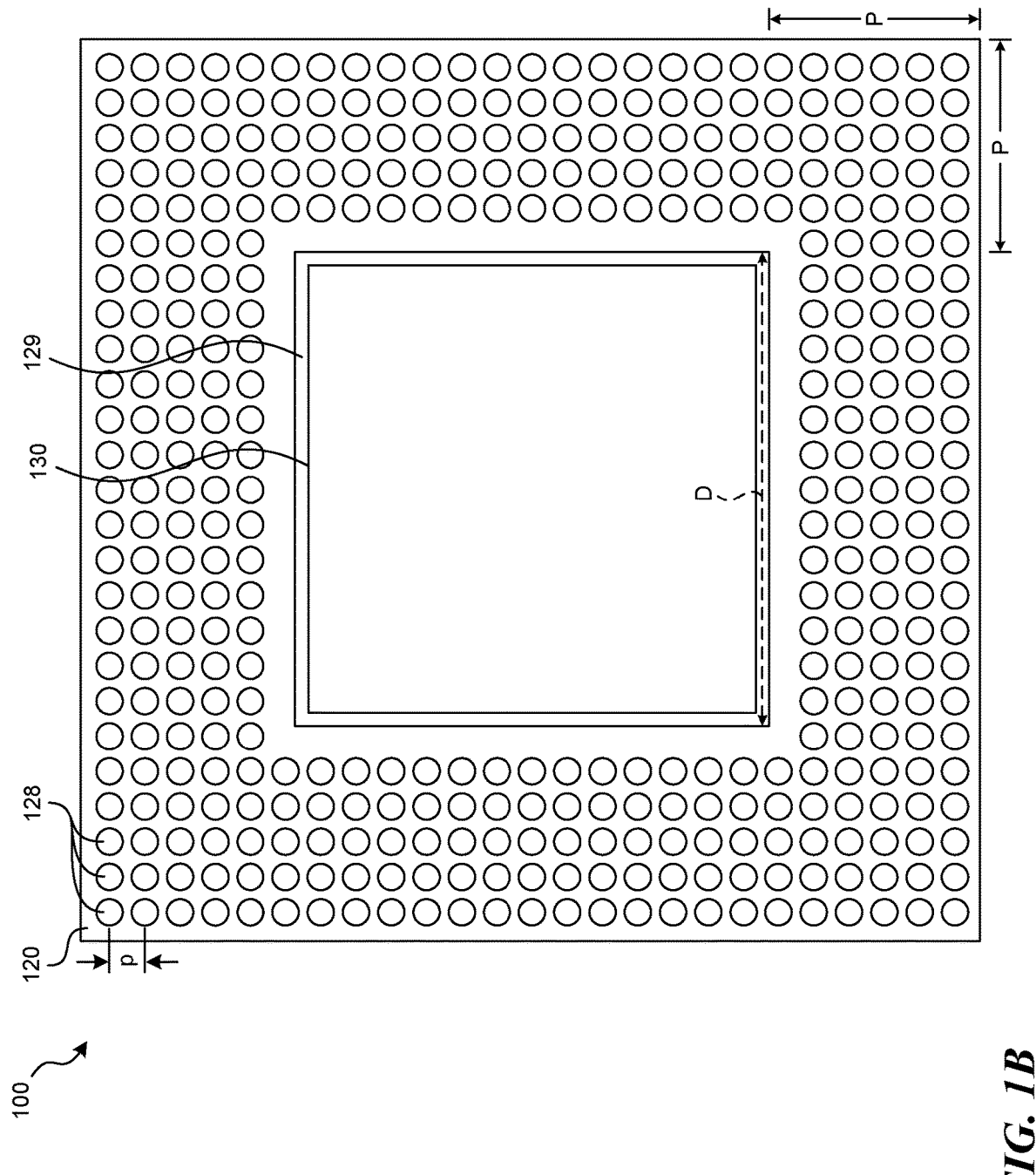
FIG. 1B is a schematic top view of the semiconductor package-on-package assembly shown in FIG. 1A taken along line 1B-1B.

FIG. 1A is a schematic top view of a POP assembly 100 ("assembly 100") in accordance with an embodiment of the present technology, and FIG. 1B is a schematic cross-sectional view of the assembly 100 taken along line 1B-1B. Referring to FIG. 1A, the assembly 100 includes a first semiconductor device package 102a and a second semiconductor device package 102b. The first semiconductor device package 102a includes a base substrate 110, a high density interconnect array 120, and a first semiconductor die 130. The base substrate 110 has a first side 112, a second side 114 opposite the first side 112, and at least one layer 116 that has circuitry (e.g., copper traces and vias) for electrically coupling the first semiconductor die 130 to electrical connectors 118. The base substrate 110, for example, can be a circuit board or other type of substrate commonly used in semiconductor device packages. In the illustrated embodiment, the base substrate 110 has a die-attach region D and a perimeter region P.

The high density interconnect array 120 can include a plurality of stacked via structures 122 (identified individually as 122a-122d in FIG. 1A) configured to create an array of tall interconnects that are spaced laterally apart from one another by a short distance. The illustrated embodiment shows four separate stratums of stacked via structures 122a-122d, but it will be appreciated that the interconnect array 120 can include any suitable number of stacked via structures 122 to provide the desired height "H" of the interconnect array 120. The individual stacked via structures 122 can each include a matrix material 124 and a plurality of interconnect segments 126 that are arranged in the array. The individual stacked via structures 122 are formed sequentially such that the vertically aligned interconnect segments 126 are electrically coupled to each other to form individual interconnects 128. By forming the interconnect segments 126 in a series of individual stratums of matrix material 124, the interconnect segments 126 can be spaced closely together and have small diameters. Additionally, by stacking the individual interconnect structures 122, the height (e.g., length) of the individual interconnects 128 can be much greater than the width of the interconnects 128 or the spacing between interconnects 128 so that the interconnect array 120 can have a height sufficient to accommodate the first semiconductor die 130 or a plurality of stacked first semiconductor dies 130. As a result, the lateral distance between individual interconnects 128 (e.g., the pitch "p") can be small. For example, the pitch p is generally less than 300 µm and more particularly approximately 50 µm-150 µm, which is significantly less than conventional interconnect arrays of POP assemblies.

Referring to FIGS. 1A and 1B together, the interconnect array 120 can be arranged in the perimeter region P of the base substrate 110 such that the interconnect array 120 defines a cavity 129 that exposes the die-attach region D at the front side 112 of the base substrate 110. It will be appreciated that the interconnect array 120 can have different configurations, such as along only one side of the first semiconductor die 130, a minimum of two sides (e.g. adjacent to each other at a corner or parallel to each other on opposite sides), or other configurations relative to the first semiconductor die 130.

Referring back to FIG. 1A, the first semiconductor die 130 is attached to the die-attach region D at the first side 112 of the base substrate 110. The first semiconductor die 130 can be electrically coupled to the circuitry (not shown) of the base substrate 110 by the electric couplers 132 (e.g., solder balls or solder bumps) using flip-chip mounting technologies. The first semiconductor die 130 shown in FIG. 1A is accordingly a silicon-on-chip configuration. In the illustrated embodiment, the height H of the interconnect assembly 120 is greater than the height of the first semiconductor die 130 relative to the front side 112 of the base substrate 110. In other embodiments, the height of the interconnect assembly 120 can be equal to or less than the height of the first semiconductor die 130 depending on the structures used to mount the second semiconductor device package 102b to the first semiconductor device package 102a.

The second semiconductor device package 102b is attached to the interconnect assembly 120 and electrically coupled to the individual interconnects 128 by electric couplers 103 (e.g., solder balls or solder bumps). The second semiconductor device package 102b can include an interposer substrate 140 and at least one second semiconductor die 150 attached to the interposer substrate 140. The interposer substrate 140 can be a circuit board or other member that includes circuitry for electrically coupling the second semiconductor die 150 to the interconnects 128 of the interconnect assembly 120. The embodiment shown in FIG. 1A includes two semiconductor dies 150 that are encapsulated by a dielectric material 160, such as a molding compound or other suitable encapsulant, and electrically coupled to the circuitry of the interposer substrate by electric couplers 152 (e.g., solder bumps or solder balls).

The second semiconductor device package 102b can be a memory device in which the semiconductor dies 150 are memory dies (e.g., DRAM, LPDRAM, SRAM, Flash, etc.), and the first semiconductor device package 102a can be a logic device, processor and/or another memory device. Additionally, even though each of the first and second semiconductor device packages 102a and 102b are shown having a single level of semiconductor dies, it will be appreciated that each of the device packages 102a and 102b can have a plurality of stacked dies within each package. For example, the first semiconductor device package 102a can have a plurality of first semiconductor dies 130 stacked on each other within the cavity 129 formed by the interconnect assembly 120. In still other embodiments, the first semiconductor die 130 can be wire bonded to the base substrate 110 and/or the second semiconductor dies 150 can be wire bonded to the interposer substrate 140 instead of using flip-chip connectors such as solder bumps or solder balls.

Figure 2A:
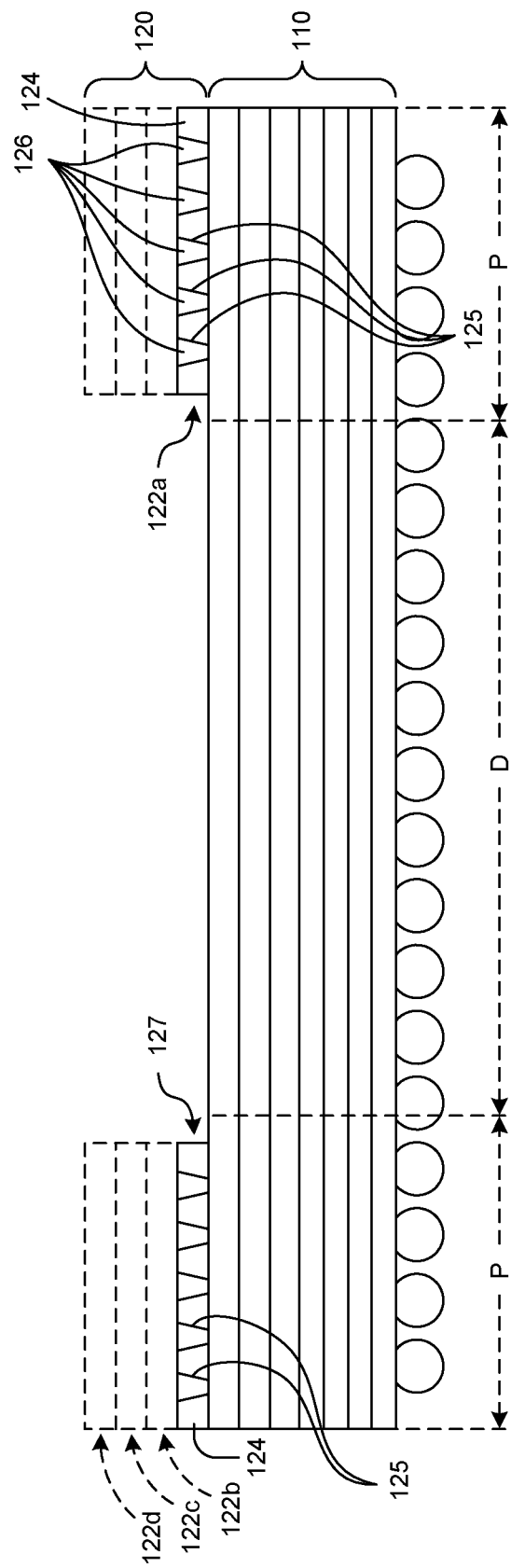
FIGS. 2A-2C are schematic cross-sectional views illustrating a method of forming a semiconductor package-on-package assembly in accordance with an embodiment of the present technology.
Figure 2B:
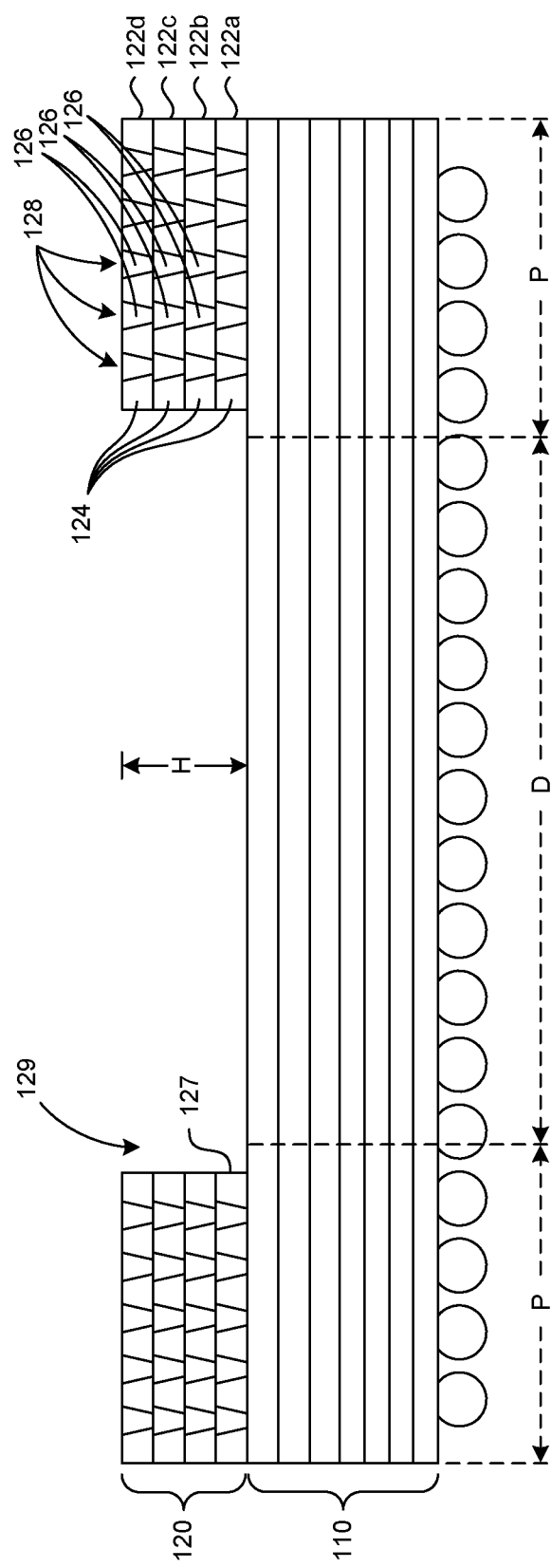
Figure 2C:
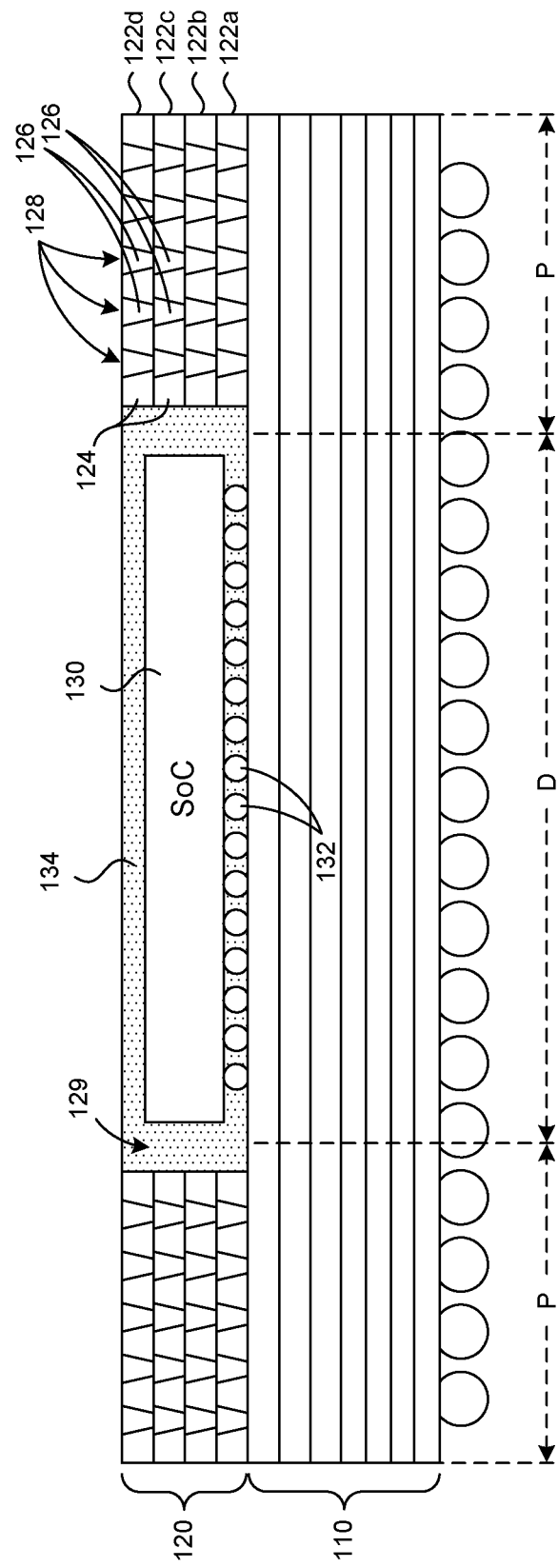

FIGS. 2A-2C are schematic cross-sectional views of a method for manufacturing a first semiconductor device package (such as the first semiconductor device package 102a) for a POP assembly (such as the POP assembly 100 shown in FIG. 1A) in accordance with an embodiment of the present technology. FIGS. 2A-2B more specifically illustrate stages of forming a high density array of interconnects in the first semiconductor device package. Like reference numbers refer to like components throughout FIGS. 1-2C.

FIG. 2A illustrates the method after the first interconnect structure 122a has been formed on or attached to the perimeter region P at the first side 112 of the base substrate 110. The first interconnect structure 122a can be made by forming a stratum of the matrix material 124 and then forming (a) a plurality of discrete holes 125 and (b) a large opening 127 through the matrix material. The matrix material 124 can be a build-up film that is deposited on the base substrate 110 or a pre-impregnated fiberglass material ("prepreg") formed apart from the substrate 110 and then attached to the perimeter region P. The holes 125 are arranged in the desired pattern of interconnects 128 of the interconnect assembly 120, and the opening 127 is configured to provide access to the die-attach region D at the first side 112 of the base substrate 110. The holes 125 and the opening 127 can be formed using laser drilling techniques or by photolithographic patterning and etching the matrix material 124. The holes 125 and the opening 127 can alternatively be formed by stamping or punching a prepreg-type matrix material that is formed apart from the base substrate 110. The discrete holes 125 are filled with a conductive material, such as copper, gold, tungsten, and/or other suitable highly conductive materials, to form the interconnect segments 126. For example, copper can be deposited into the holes 125 using electroplating, electroless plating, or other suitable deposition techniques known in the semiconductor manufacturing arts. In one embodiment, copper can be plated in the holes by depositing a copper seed layer using physical vapor deposition (PVD) or chemical vapor deposition (CVD) techniques, and then bulk plating copper on to the seed layer using electroplating or electroless plating processes. Tungsten, on the other hand, can be deposited using CVD, PVD or other techniques.

In one embodiment, each interconnect structure 122 is formed separately apart from the base substrate 110. In such embodiments the conductive material is accordingly deposited into the holes 125 before the interconnect structure 122 is attached to the base substrate 110. For example, the first interconnect structure 122a can be formed separately and then attached to the first side 112 of the base substrate. The other individual interconnect structures 122b-d can also be formed separately and sequentially stacked on the first interconnect structure 122a. Alternatively, all of the individual interconnect structures 122 can be formed separately apart from the base substrate 110 and stacked on each other apart from the base substrate 110 such that the entire interconnect array 120 is preassembled before it is attached to the base substrate 110.

In another embodiment, the individual interconnect structures 122 can be formed sequentially on or over the base substrate 110. For example, the first interconnect structure 122a can be formed on the first surface 112 of the base substrate 110 by (a) depositing the matrix material 124 on the first surface 112, (b) forming the holes 125 in the matrix material 124, and then (c) filling the holes 125 with a conductive material to form the interconnects segments 126. The second interconnect structure 122b can then be similarly formed on the first interconnect structure 122a (shown in dotted lines), and additional interconnect structures 122c and 122d can be formed sequentially (shown in dotted lines). The opening 127 can be formed either before or after filling the holes 125 with the conductive material. For example, the opening 127 can be formed in one stratum of the matrix material 124 before the next stratum of matrix material 124 is deposited. In an alternative embodiment, a plurality of the stratums of the matrix material 124 for the interconnect structures 122a-d can be deposited and processed to form the interconnect segments 126 in each stratum, and then the opening 127 can be formed through all of the stratums of matrix material 124 in a single step.

FIG. 2B illustrates an embodiment of the method after the full interconnect assembly 120 has been completed. At this stage of the process, the interconnect assembly 120 has the desired height H so that the cavity 129 is deep enough to accommodate one or more of the first semiconductor dies 130. The interconnect assembly 120, and accordingly the individual interconnects 128, are formed before the first semiconductor die 130 is attached to the die-attach area D of the base substrate 110.

FIG. 2C illustrates an embodiment of the method after the first semiconductor die 130 has been mounted to the base substrate 110 in the die-attach region D. In the illustrated embodiment, the first semiconductor die 130 is attached to the base substrate 110 and electrically coupled to the base substrate circuitry therein by a plurality of individual couplers 132 (e.g., solder balls or solder bumps). In one embodiment, an optional encapsulant or underfill material 134 can be deposited into the cavity 129 to encase the first semiconductor die 130. The second semiconductor device package 102b (FIG. 1A) can subsequently be attached to the interconnect assembly 120 by the couplers 103 (FIG. 1A) to complete the POP assembly 100 shown in FIG. 1A.

Figure 3:
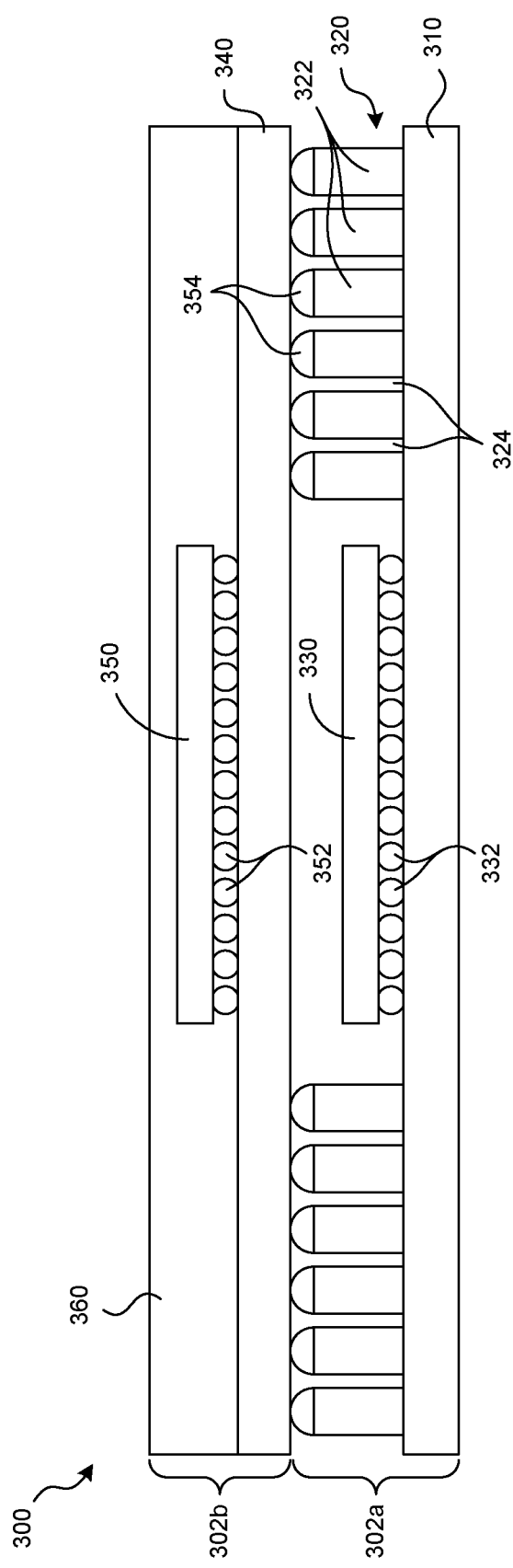
FIG. 3 is a schematic cross-sectional view of a semiconductor package-on-package assembly in accordance with another embodiment of the present technology.

FIG. 3 is a schematic cross-sectional view illustrating a POP assembly 300 ("assembly 300") in accordance with another embodiment of the present technology. The assembly 300 can include a first semiconductor device package 302a and a second semiconductor device package 302b. The first semiconductor device package 302a can include a base substrate 310, an interconnect array 320 located in a peripheral region of the base substrate 310, and a first semiconductor die 330 located in a die-attach region of the base substrate 310 and electrically coupled to the base substrate 310 by couplers 332 (e.g., solder balls or solder bumps). The second semiconductor device package 302b can include an interposer substrate 340, a second semiconductor die 350 electrically coupled to the interposer substrate 340 by couplers 352 (e.g., solder balls or solder bumps), and an encapsulant 360 covering the second semiconductor die 350. The assembly 300 can further include electrical couplers 354 that electrically connect the second semiconductor device package 302b to the interconnect assembly 320.

In the embodiment illustrated in FIG. 3, the interconnect assembly 320 has a plurality of interconnects 322 that are separated from one another by gaps 324. The individual interconnects 322, for example, can be freestanding conductive posts made from copper or other suitable electrically conductive materials.

Figure 4A:
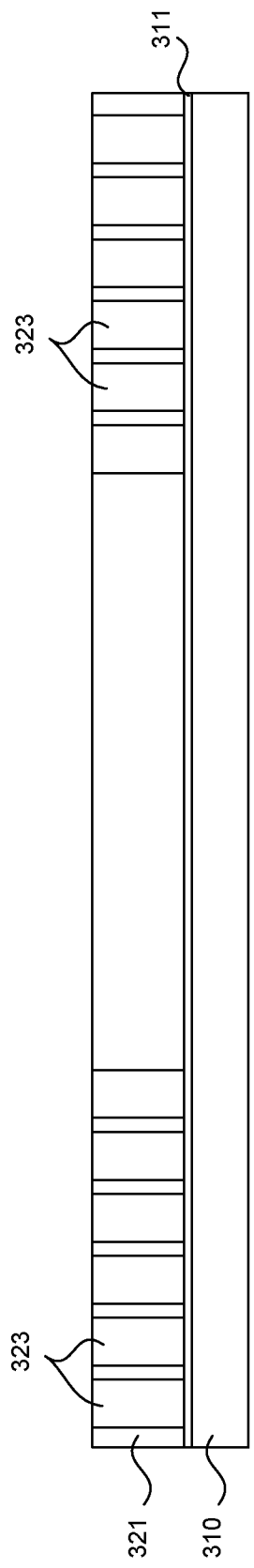
Figure 4B:
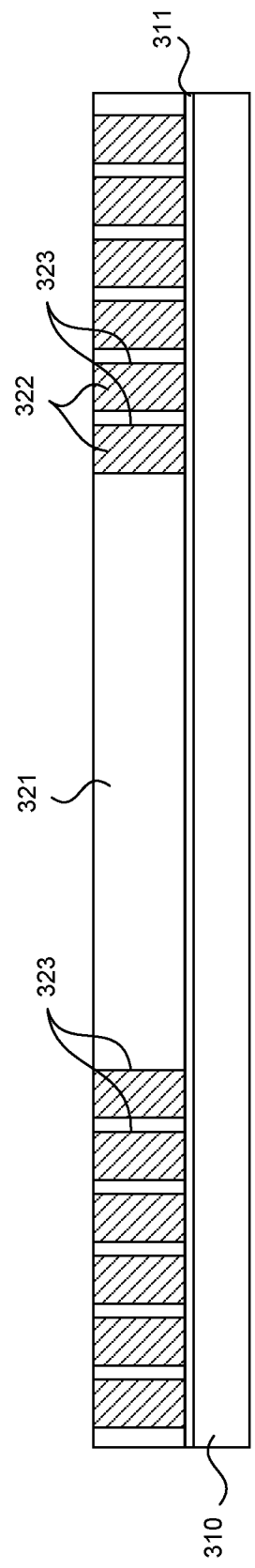

FIGS. 4A-4C are schematic cross-sectional views of a method for manufacturing the assembly 300 in accordance with an embodiment of the technology. FIG. 4A illustrates the method after a photo-imageable material 321 has been deposited onto the base substrate 310 and patterned to form a plurality of holes 323. The pattern of holes 323 can be arranged to correspond to the configuration of the interconnects 322 of the interconnect assembly 320.

FIG. 4B illustrates the method after a conductive material, such as copper, has been deposited into the holes 323 to form the individual interconnects 322. The conductive material can be deposited using electroplating, electroless plating, and/or other suitable deposition techniques used in the semiconductor arts. For example, in one embodiment a seed layer (FIG. 4A) can be deposited onto the top of the base substrate 310 using PVD or CVD techniques before the photo-imageable material 321 has been deposited. In such cases, the photo-imageable material 321 is then deposited onto the seed layer 311 (FIG. 4A). A bulk conductive material can then be electroplated onto the seed layer to fill the openings 323 (FIG. 4B).

FIG. 4C illustrates the method after the photo-imageable material 321 has been removed to form the gaps 324 between the interconnects 322 and an open region 329 over the die-attach region of the base substrate 310. The seed layer 311 (FIGS. 4A and 4B) is then removed from the top surface of the base substrate 310 such that the interconnects 322 are electrically isolated from each other. The interconnects 322 in the embodiment illustrated in FIG. 4C are accordingly freestanding relative to each other.

FIG. 4D shows the method after the first semiconductor die 330 has been attached to the base substrate 310 in the die-attach region. The second semiconductor device package 302b can then be attached to the interconnects 322 to form the POP assembly 300 shown in FIG. 3.

From the foregoing, it will be appreciated that specific embodiments of the invention have been described herein for purposes of illustration, but that various modifications may be made without deviating from the scope of the invention. For example, the interconnects 322 shown in FIG. 3 can be conductive posts formed by three-dimensional printing techniques. Accordingly, the invention is not limited except as by the appended claims.

We claim:

1. A package-on-package system, comprising:
    a first semiconductor device package having—
        a base substrate including a first side having a die-attach region and a perimeter region and a second side opposite the first side;
        a plurality of electrical connectors carried by the second side of the base substrate;
        a first semiconductor die attached to the first side of the base substrate at the die-attach region; and
        an interconnect array over the perimeter region of the first side of the base substrate and outside of the die-attach region, wherein the interconnect array comprises a plurality of interconnect structures stacked on the first side of the base substrate, and wherein each individual interconnect structure includes a stratum of a matrix material and a plurality of interconnect segments arranged in a pattern of the interconnect array; and
    a second semiconductor device package having—
        an interposer substrate having a plurality of package terminals, wherein each individual package terminal is electrically coupled to a corresponding individual interconnect segment; and
        a second semiconductor die attached to the interposer substrate.

2. The system of claim 1 wherein the interposer substrate includes a top side and a bottom side, and wherein the second semiconductor die is attached to the top side of the interposer substrate.

3. The system of claim 1 wherein the plurality of interconnect structures include a first interconnect structure attached to the perimeter region of the base substrate, and wherein the plurality of interconnect structures include a plurality of second interconnect structures stacked on the first interconnect structure.

4. The system of claim 1 wherein the matrix material includes a build-up film deposited on the base substrate.

5. The system of claim 1 wherein the matrix material includes a pre-impregnated fiberglass material attached to the perimeter region.

6. The system of claim 1 wherein the plurality of interconnect segments include a conductive material.

7. The system of claim 1 wherein the plurality of interconnect segments include at least one of the following: copper, gold, or tungsten.

8. The system of claim 1 wherein the first semiconductor die has a front side facing the first side of the base substrate and a backside spaced apart from the first side of the base substrate by a first distance.

9. The system of claim 8 wherein the plurality of interconnect structures extend from the first side of the base substrate by a second distance greater than the first distance.

10. The system of claim 1 wherein the perimeter region is spaced laterally with respect to the die-attach region.

11. The system of claim 1 wherein the plurality of interconnect segments are aligned along a common line normal to a surface of the base substrate.

12. The system of claim 1 wherein the first semiconductor die is electrically connected to the second semiconductor die via the interconnect array.

13. A semiconductor device package, comprising:
    a base substrate including a first side having a die-attach region and a perimeter region, and a second side opposite the first side;
    a plurality of electrical connectors at the second side of the base substrate;
    a first semiconductor die attached to the base substrate at the die-attach region; and
    an interconnect array over the perimeter region of the base substrate and outside of the die-attach region, wherein the interconnect array comprises a plurality of interconnect structures stacked on the base substrate, and wherein each individual interconnect structure includes a stratum of a matrix material and a plurality of interconnect segments arranged in a pattern of the interconnect array;
    wherein the first semiconductor die is electrically connected to a second semiconductor die via the interconnect array.

14. The semiconductor device package of claim 13 wherein the second semiconductor die is attached to an interposer substrate.

15. The semiconductor device package of claim 14 wherein the interposer substrate includes a plurality of package terminals, and wherein each individual package terminal is electrically coupled to a corresponding individual interconnect segment.

16. The semiconductor device package of claim 13 wherein the plurality of interconnect structures include a first interconnect structure attached to the perimeter region of the base substrate, and wherein the plurality of interconnect structures include a plurality of second interconnect structures stacked on the first interconnect structure.

17. The semiconductor device package of claim 13 wherein the matrix material includes a film deposited on the base substrate.

18. The semiconductor device package of claim 13 wherein the matrix material includes a fiberglass material attached to the perimeter region.

19. The semiconductor device package of claim 13 wherein the plurality of interconnect segments include a conductive material.

20. The semiconductor device package of claim 13 wherein the plurality of interconnect segments include at least one of the following: copper, gold, or tungsten.

* * * * *